(12) United States Patent
Hayashi

(10) Patent No.: US 10,687,439 B2
(45) Date of Patent: *Jun. 16, 2020

(54) HIGH-DENSITY SERVER WITH REDUNDANT POWER SOURCE FOR SERVER MODULES

(71) Applicant: NEC Corporation, Minato-ku, Tokyo (JP)

(72) Inventor: Toshiyuki Hayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/626,354

(22) Filed: Jun. 19, 2017

(65) Prior Publication Data

US 2017/0303428 A1    Oct. 19, 2017

Related U.S. Application Data

(63) Continuation of application No. 13/949,896, filed on Jul. 24, 2013, now Pat. No. 9,717,160.

(30) Foreign Application Priority Data

Jul. 26, 2012   (JP) ................................ 2012-165749

(51) Int. Cl.
*H05K 7/20*   (2006.01)
*G06F 1/18*   (2006.01)
(Continued)

(52) U.S. Cl.
CPC ......... *H05K 7/20136* (2013.01); *G06F 1/184* (2013.01); *G06F 1/20* (2013.01); *H05K 7/1485* (2013.01); *H05K 7/1492* (2013.01)

(58) Field of Classification Search
CPC ............. H05K 7/20136; H05K 7/1492; H05K 7/1485; G06F 1/184; G06F 1/20
(Continued)

(56) References Cited

U.S. PATENT DOCUMENTS 6,563,706 B1    5/2003   Strickler ............ H05K 7/20718
                                                  165/122
6,821,141 B1    11/2004  Liu .................. H01R 13/62905
                                                  361/802
(Continued)

FOREIGN PATENT DOCUMENTS

JP    2003-044163 A    2/2003
JP    2006-73045 A     3/2006
(Continued)

OTHER PUBLICATIONS

HP, "HP ProLiant SL6500 Scalable System technologies", browsed via the Internet at URL <http://h20000.www2.hp.com/bc/docs/support/SupportManual/c02664768/c02664768.pdf>, See cited doc (Non-Patent Literature 12 on p. 4 of the Applicant's Specification.
(Continued)

*Primary Examiner* — Jayprakash N Gandhi
*Assistant Examiner* — Stephen S Sul

(57) ABSTRACT

A high-density server includes a plurality of server enclosures, each of which includes an enclosure housing with a pair of module insertion/extraction parts, a pair of power source units, a plurality of cooling fans, and two pairs of server modules. Cooling fans are linearly aligned in a crosswise direction and positioned in proximity to the rear opening of the enclosure housing with upper rear openings and lower rear openings, while server modules are installed in module insertion/extraction parts inside the enclosure housing in an insertable/removable manner. Server modules have module trays for mounting electronic components and interface units. Interface units are retractively inserted into upper rear openings or lower rear openings in connection with power source units when server modules are moved in a lengthwise direction along module insertion/extraction parts inside the enclosure housing. The server enclosure is equipped with a redundant power transmitter establishing
(Continued)

redundant multipoint-to-multipoint connections between power source units and server modules.

7 Claims, 13 Drawing Sheets

(51) Int. Cl.
*G06F 1/20* (2006.01)
*H05K 7/14* (2006.01)

(58) Field of Classification Search
USPC ...... 361/679.49, 679.48, 688, 690, 694, 695
See application file for complete search history.

(56) References Cited

U.S. PATENT DOCUMENTS

| | | | | |
|---|---|---|---|---|
| 6,826,456 | B1 | 11/2004 | Irving | G06F 1/20 361/695 |
| 7,839,624 | B2 | 11/2010 | Lin | G04F 1/84 361/679.02 |
| 9,717,160 | B2* | 7/2017 | Hayashi | H05K 7/20136 |
| 2004/0100765 | A1* | 5/2004 | Crippen | G06F 1/20 361/679.48 |
| 2004/0130865 | A1 | 7/2004 | Vanderheyden et al. | |
| 2005/0195075 | A1* | 9/2005 | McGraw | G06F 1/18 340/500 |
| 2006/0221579 | A1* | 10/2006 | Liang | H05K 7/1445 361/724 |
| 2006/0227525 | A1 | 10/2006 | Hoshino | G06F 1/185 361/796 |
| 2006/0248360 | A1 | 11/2006 | Fung | G06F 1/206 713/300 |
| 2007/0207720 | A1* | 9/2007 | Henry | H05K 7/1445 454/184 |
| 2007/0247826 | A1* | 10/2007 | Grady | H05K 7/1492 361/796 |
| 2008/0244052 | A1 | 10/2008 | Bradicich | G06F 1/183 709/223 |
| 2009/0016010 | A1 | 1/2009 | Vinson | G11B 33/124 361/679.31 |
| 2011/0149500 | A1* | 6/2011 | Miyamoto | G11B 33/128 361/679.31 |
| 2011/0191503 | A1 | 8/2011 | Kakish | |
| 2012/0295453 | A1 | 11/2012 | Cipolla | H01R 12/716 439/67 |
| 2013/0033815 | A1 | 2/2013 | Yang | G06F 1/186 361/679.46 |
| 2013/0135817 | A1 | 5/2013 | Xu | G06F 1/181 361/679.37 |
| 2013/0155600 | A1 | 6/2013 | Ross | H05K 7/1487 361/679.31 |
| 2013/0235524 | A1* | 9/2013 | Baba | H05K 7/1452 361/695 |

FOREIGN PATENT DOCUMENTS

| | | |
|---|---|---|
| JP | 2006-164040 A | 6/2006 |
| JP | 2010-61243 A | 3/2010 |
| JP | 2011-054142 A | 3/2011 |
| JP | 2011-166720 A | 8/2011 |

OTHER PUBLICATIONS

Tyan, "Tyan YR190-B7018 Service Engineer's Manual", browsed via the Internet at URL <http://www.tyan.com/manuals/B7018Y190X2_UG_V1.1a.pdf>. See cited doc (Non-Patent Literature 2) on p. 4 of the Applicant's Specification.

Dell, "PowerEdge 06100 Rack Server" (written in Japanese), browsed via the Internet at URL <http://www.dell.com/jp/enterprise/p/poweredge-c6100/pdπ>. See cited doc (Non-Patent Literature 3) on p. 4 of the Applicant's Specification.

Dell, "PowerEdge C6100 Rack Server" (written in English), browsed via the Internet at URL <http://www.dell.com/us/business/p/poweredge-c6100/pdf>. See cited doc (Non-Patent Literature 4) on p. 5 of the Applicant's Specification.

Japanese Notice of Allowance for JP Application 2012-165749 dated Oct. 1, 2013 with partial English Translation.

\* cited by examiner

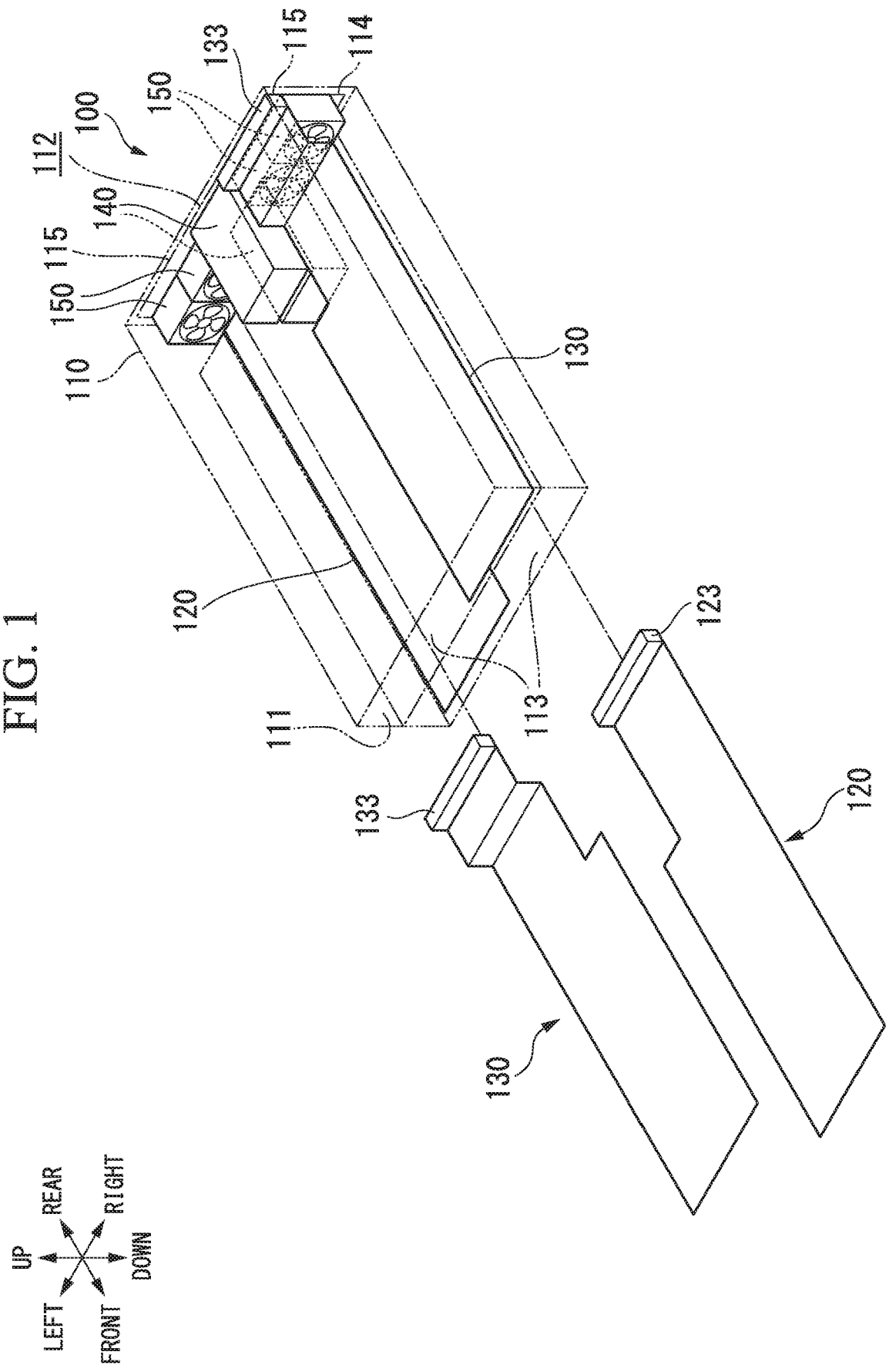
FIG. 1
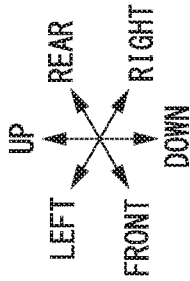

FIG. 4
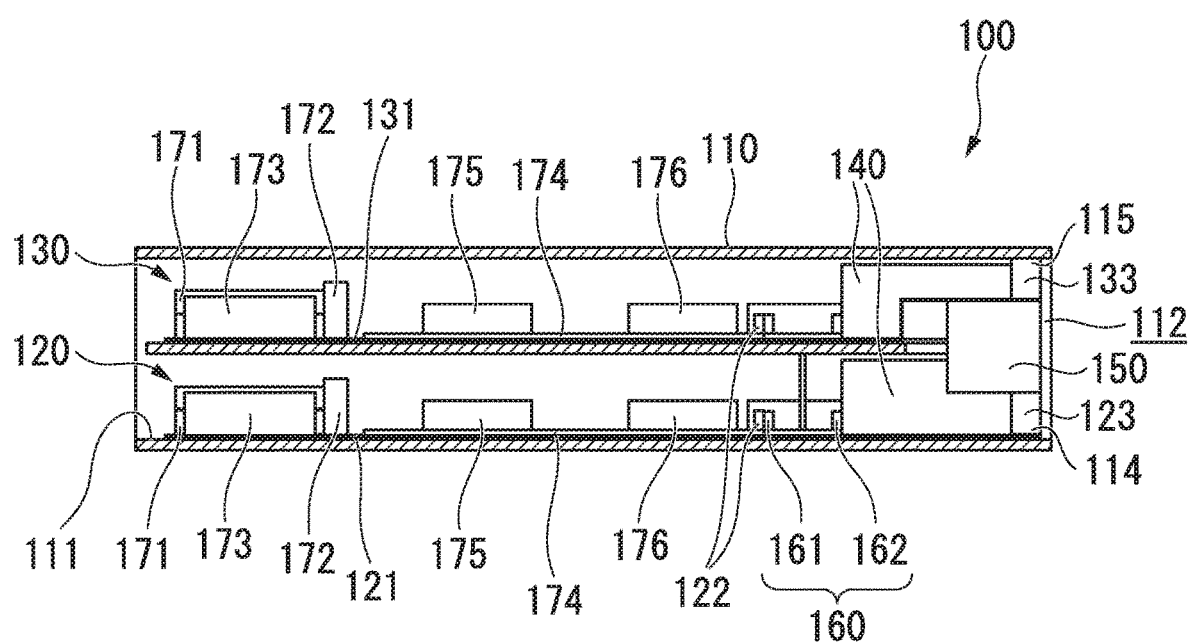
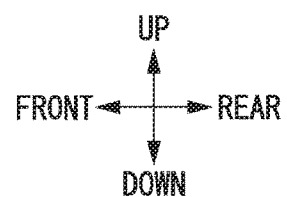

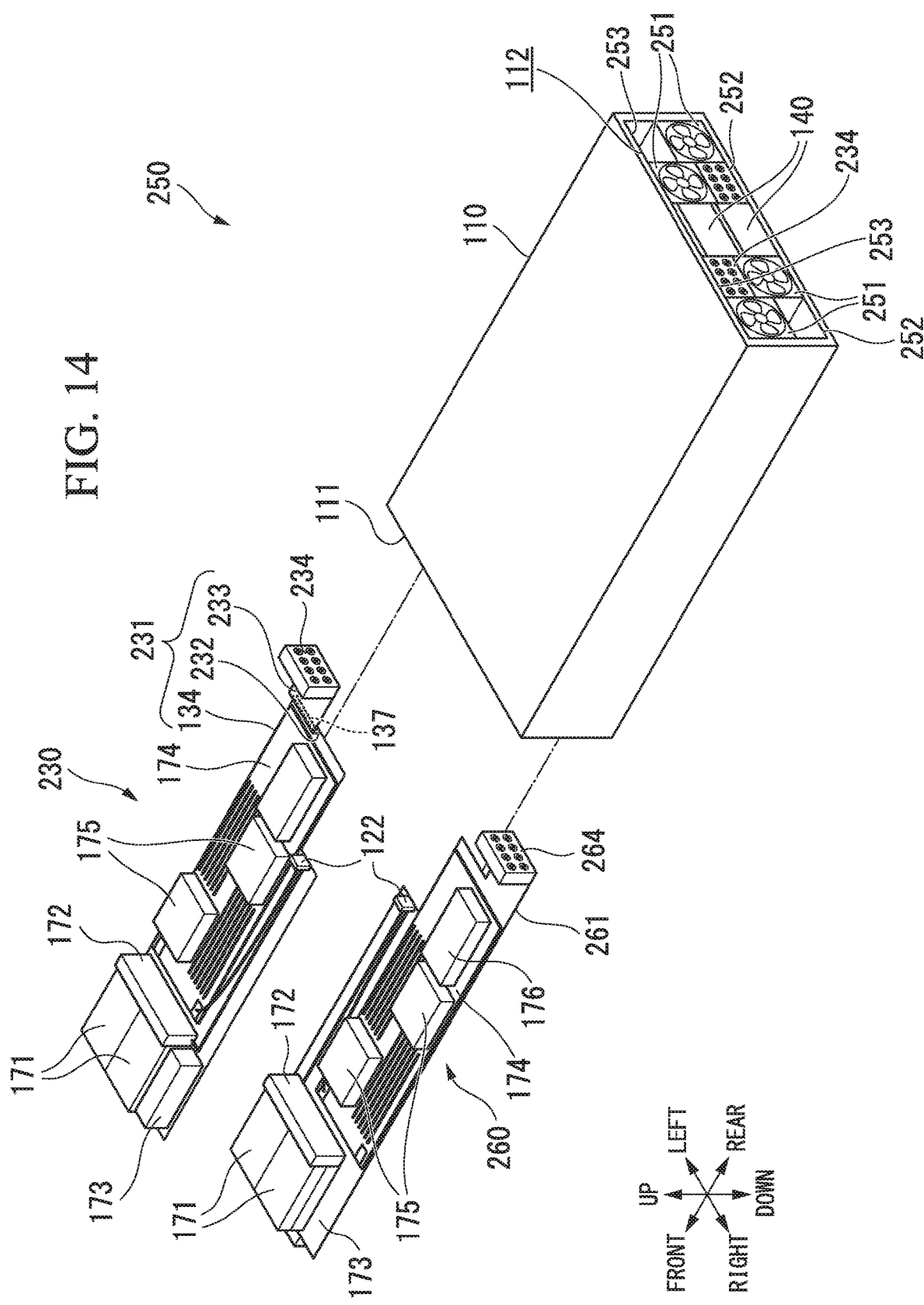

HIGH-DENSITY SERVER WITH REDUNDANT POWER SOURCE FOR SERVER MODULES

REFERENCE TO RELATED APPLICATION

The present application is a continuation application of U.S. patent application Ser. No. 13/949,896 filed on Jul. 24, 2013, which claims the benefit of priority from Japanese Patent Application 2012-165749 filed on Jul. 26, 2012, the disclosures of all of which are incorporated by reference herein in their entirety.

BACKGROUND OF THE INVENTION

Field of the Invention

The present invention relates to a high-density server including a plurality of server modules with redundant power sources.

Description of the Related Art

Conventionally, high-density servers are each designed to include a plurality of server enclosures, each enclosing a plurality of server modules. Specifically, high-density servers are each designed to include a server rack accommodating a plurality of enclosure insertion/extraction parts which are vertically combined together. A plurality of server enclosures is individually put into enclosure insertion/extraction parts installed in a server rack such that server enclosures can be freely inserted into or pulled out from enclosure insertion/extraction parts. A plurality of server enclosures is cast into an enclosure frame accommodating a plurality of front insertion/extraction parts which are arranged vertically and horizontally. A plurality of server modules is individually put into a plurality of front insertion/extraction parts, arranged inside an enclosure frame, such that server modules can be freely inserted into or pulled out from front insertion/extraction parts. Each server module may include a CPU and/or an HDD (Hard Disk Drive) unit.

As described above, a high-density server may install a plurality of server modules therein, thus implementing parallel processing and complex computation with a plurality of server modules. Each server module needs electrical power which inevitably causes high heat during computation. For this reason, a high-density server requires a power source unit and cooling fans in server enclosures.

Patent Literature 1 and Patent Literature 4 disclose a motherboard having compatibility with various types of universal serial buses (USB), which includes a connector connected to a host controller interface and a serial bus unit coupled with a host controller. Patent Literature 2 discloses an insertion-type module computer in which a module computer is connected to a rear connector attached to a flat-panel monitor including various connectors conventionally installed in a motherboard. Patent Literature 3 discloses an electronic circuit board with extended function or communication function (e.g. a communication daughter card) which is detachably attached to a motherboard of a computer system. Patent Literature 5 discloses an industrial computer chassis structure with a centrally-disposed power source, which is partitioned into a plurality of motherboard sections each of which allows a motherboard to be pulled therein or drawn therefrom.

Additionally, Non-Patent Literature 1 discloses a scalable computing system accommodating a plurality of server insertion/extraction parts in a specially-designed chassis. Non-Patent Literature 2 discloses a rack-mountable barebones configuration of a server system offering scalable computation. Non-Patent Literature 3 (i.e. a Japanese webpage) discloses a rack server with a rack chassis offering a high density of servers and reducing power consumption. Non-Patent Literature 4 is an English-language webpage corresponding to Non-Patent Literature 3.

Non-Patent Literature 1 teaches an example of a server layout in which a power source unit and cooling fans are arranged in a rear opening formed at a rear portion of a server enclosure. Herein, it is necessary to arrange external interfaces, such as an I/O port, a LAN connector, or a PCI (Peripheral Component Interconnect) slot, as well as a HDD unit and an operation panel in the front face of a server module. This allows users to easily access a HDD unit and an operation panel on the front face of a server enclosure, collectively aggregating external wires which can be freely connected to or disconnected from external interfaces.

Non-Patent Literature 2 teaches a high-density server including a plurality of server modules each of which is equipped with a power source unit and a cooling fan. This technology allows a power source unit and a cooling fan to be arranged in the center area of each server module. Thus, it is possible to arrange an HDD unit and an operation panel on the front face of each server module while arranging external interfaces (e.g. an I/O port, an LAN connector, and a PCI slot) on the rear side of each server module.

Non-Patent Literatures 3 and 4 disclose a high-density server in which a plurality of cooling fans is aligned inside of each server enclosure, wherein an HDD unit and an operation panel are arranged on the front side of each server module while a server module is arranged in the rear side of each server module. Thus, it is possible to arrange an HDD unit and an operation panel on the front side of each server module while arranging external interfaces (e.g. an I/O port, a LAN connector, and a PCI slot) on the rear side of each server module.

As described above, conventional high-density servers allow users to easily access HDD units and operation panels in the front side while arranging external wires, detachably connected to external interfaces, in the rear side. However, they may involve drawbacks and disadvantages as follows.

The technology of Non-Patent Literature 1, which arranges a power source unit and a cooling fan in the rear opening of each server enclosure while arranging external interfaces on the front face of each server module, needs to collectively aggregate external wires connected to external interfaces on the front face of each server module. External wires connected to external interfaces may cause a mess in the front face of each server module because they may physically block users from accessing HDD units and operational panels.

The technology of Non-Patent Literature 2, which arranges an HDD unit and a cooling fan in the center area of each server module, needs to install pairs of power source units and cooling fans in connection with a plurality of server modules therein. This may unnecessarily reduce the effective area of each server module. Additionally, it is impossible to share a large-sized power source unit and large-sized cooling fans with a plurality of server modules.

The technology of Non-Patent Literature 3, in which a plurality of cooling fans is aligned inside each server enclosure and in which an HDD unit and an operation panel are arranged in the front side while a server module is arranged in the rear side, may involve a difficulty of inserting a server module into or removing a server module from each server enclosure in excess of an advantage of a user's easy access to an HDD unit and an operation panel on the front side of each server enclosure.

CITATION LIST

Patent Literature

Patent Literature 1: Japanese Patent Application Publication No. 2011-166720
Patent Literature 2: Japanese Patent Application Publication No. 2011-054142
Patent Literature 3: Japanese Patent Application Publication No. 2003-044163
Patent Literature 4: U.S. Patent Application Publication No. US 2011/0191503 A1
Patent Literature 5: U.S. Pat. No. 7,839,624 B2

Non Patent Literature

Non-Patent Literature 1: "HP ProLiant SL6500 Scalable System technologies", browsed via the Internet at URL "http://h20000.www2.hp.com/bc/docs/support/Support-Manual/c02664768/c02664768.pdf"
Non-Patent Literature 2: "TYAN YR190-B7018 Service Engineer's Manual", browsed via the Internet at URL "http://www.tyan.com/manuals/B7018Y190X2_UG_v1.1a.pdf"
Non-Patent Literature 3: "PowerEdge C6100 Rack Server" (written in Japanese), browsed via the Internet at URL "http://www.dell.com/jp/enterprise/p/poweredge-c6100/pd#"
Non-Patent Literature 4: "PowerEdge C6100 Rack Server" (written in English), browsed via the Internet at URL "http://www.dell.com/us/business/p/poweredge-c6100/pd"

SUMMARY OF THE INVENTION

It is an object of the present invention to provide a high-density server including a plurality of server modules with a redundant power source. In particular, the present invention aims to provide users with easy and free access to any devices and consoles installed in a high-density server while providing a redundant power source shared by a plurality of nodes installed in a plurality of server modules.

A first aspect of the present invention is directed to a server enclosure including: an enclosure housing including a pair of module insertion/extraction parts vertically adjoining together, a front opening, and a rear opening; a pair of power source units which is placed at the center position in plan view, communicating with a pair of module insertion/extraction parts, in proximity to the rear opening of the enclosure housing; a plurality of cooling fans which are placed at predetermined positions communicating with a pair of module insertion/extraction parts and which are separately arranged in the left side and the right side of a pair of power source units, and each of which is positioned in the rear opening of the enclosure housing with an upper rear opening thereabove or a lower rear opening therebelow; a pair of lower server modules, having lower interface units at the rear ends thereof, which are installed in the lower module insertion/extraction part in an insertable/removable manner in connection with the power source unit; and a pair of upper server modules, having upper interface units at the rear ends thereof, which are installed in the upper module deck in an insertable/removable manner in connection with the power source unit. The lower interface unit is retractively inserted into the lower rear opening when the lower server module is moved in front-rear directions along the lower module insertion/extraction part inside the enclosure housing, while the upper interface unit is retractively inserted into the upper rear opening when the upper server module is moved in front-rear directions along the upper module insertion/extraction part inside the enclosure housing.

A second aspect of the present invention is directed to an enclosure housing including: a front opening; a rear opening; a pair of module insertion/extraction parts vertically adjoining together; a pair of power source units which is placed at the center position in plan view, communicating with a pair of module insertion/extraction parts, in proximity to the rear opening; and a plurality of cooling fans which are separately arranged in the left side and the right side of a pair of power source units, and each of which is positioned in the rear opening with an upper rear opening thereabove or a lower rear opening therebelow.

A third aspect of the present invention is directed to a server module adapted to the server enclosure, including: a module tray including a main part, a module-standing rear part disposed vertically at the rear end of the main part, and a module-extended rear part disposed horizontally at the upper end of the module-standing rear part; and an interface unit which is attached to the rear end of the module-extended rear part of the module tray. The interface unit is detachably connected to the power source unit when the module tray is installed in the module insertion/extraction part in an insertable/removable manner inside the enclosure housing.

A fourth aspect of the present invention is directed to a redundant power transmitter establishing redundant multipoint-to-multipoint connections between a pair of power source units vertically adjoining together and two pairs of server modules horizontally and vertically adjoining together inside a server enclosure.

A fifth aspect of the present invention is directed to a high-density server including: a server rack; and a plurality of enclosure insertion/extraction parts which are formed inside the server rack to vertically adjoin together. The server enclosure, including a pair of power source units vertically adjoining together and two pairs of server modules horizontally and vertically adjoining together with a redundant power transmitter, is mountable on the enclosure insertion/extraction part inside the server rack.

The present invention demonstrates advantageous effects, which will be described blow.

(1) The server enclosure is designed to arrange power source units and cooling fans in proximity to the rear opening of the enclosure housing while arranging user-operable components (e.g. HDD units and operation panels which may need maintenance and manual operation) in the front side of the enclosure housing. This structure does not need to arrange external interfaces such as I/O ports in the front side of the enclosure housing.

(2) This structure does not cause a mess in the front side of the server enclosure due to external wires connected to external interfaces; hence, it is possible to prevent external wires from hindering user's access to user-operable components in the front side of the server enclosure.

(3) It is unnecessary for this structure to independently install power source units and cooling fans with respect to a plurality of server modules installed in a server enclosure applied to a high-density server. This layout does not reduce the effective area of each server module because the server enclosure can be equipped with a large-sized power source unit and a large-sized cooling fan which are shared by a plurality of server modules.

(4) Server modules can be easily inserted into the front opening and installed in module insertion/extraction parts inside the enclosure housing in an insertable/removable manner. This structure allows users to extract server modules from the front opening of the server enclosure, thus carrying out maintenance work on server modules with ease.

BRIEF DESCRIPTION OF THE DRAWINGS

FIG. 1 is an exploded perspective view of a server enclosure including a pair of module insertion/extraction parts which vertically adjoin together so as to accommodate two pairs of server modules horizontally and vertically adjoining together according to a first embodiment of the present invention.

FIG. 4 is a cross-sectional view of the server enclosure with an enclosure housing in which a pair of server modules is installed in a pair of module insertion/extraction parts vertically adjoining together.

FIG. 14 is an exploded perspective view of the server enclosure according to the fourth embodiment of the present invention in a different viewing angle.

DESCRIPTION OF THE PREFERRED EMBODIMENTS

Figure 2:
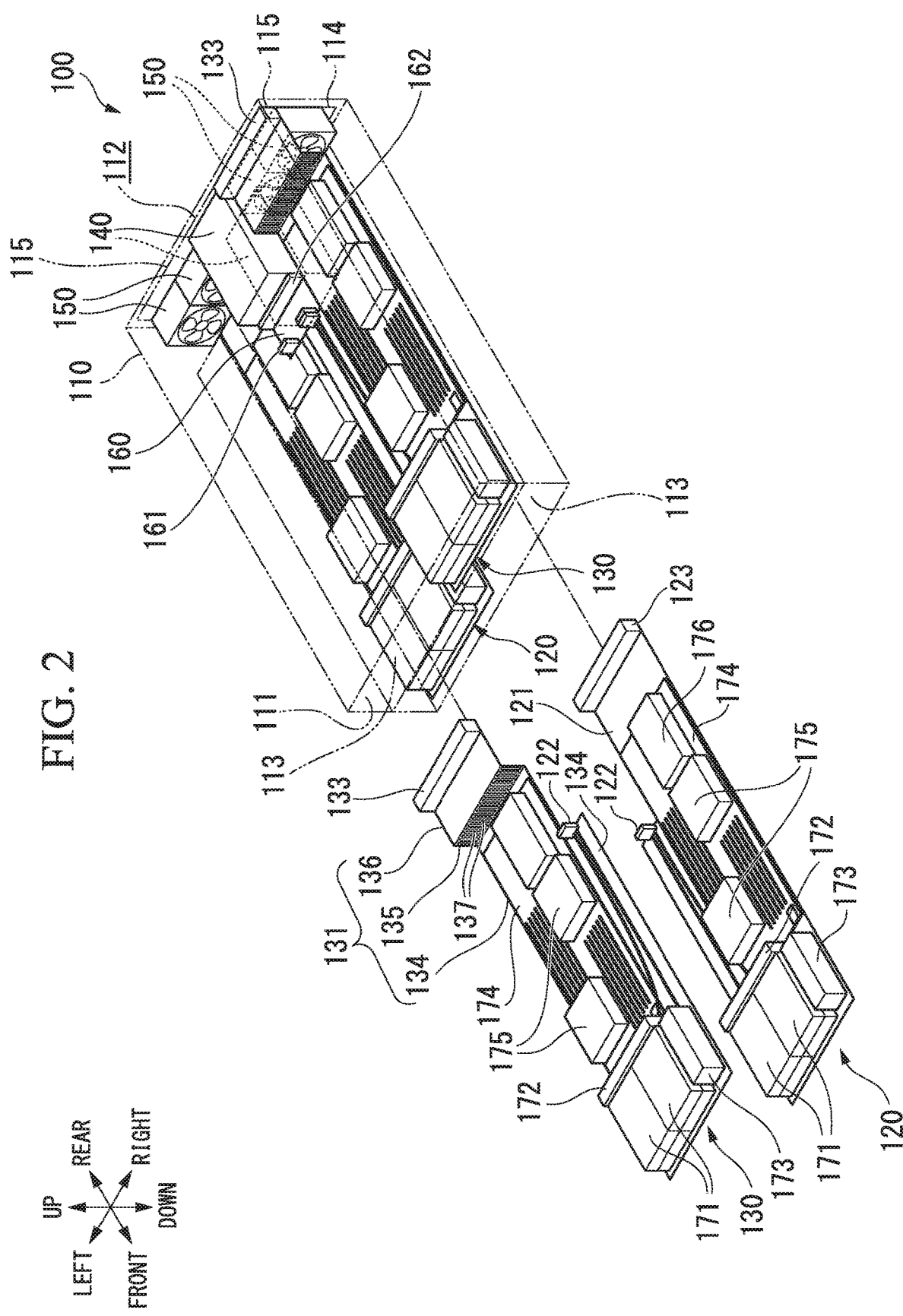
FIG. 2 is an exploded perspective view of a server enclosure with an enclosure housing accommodating two pairs of server modules according to a second embodiment of the present invention.

The present invention will be described in further detail by way of examples with reference to the accompanying drawings.

1. First Embodiment

FIG. 1 is an exploded perspective view of a server enclosure 100 including a pair of module insertion/extraction parts 113 which vertically adjoin together so as to accommodate two pairs of server modules 120, 130, which horizontally and vertically adjoin together, according to a first embodiment of the present invention. The server enclosure 100 includes an enclosure housing 110, a pair of power supply units 140, a plurality of cooling fans 150, a pair of lower server modules 120 with a pair of lower interface units 123, and a pair of upper server modules 130 with a pair of upper interface units 133. The enclosure housing 110 has a front opening 111 and a rear opening 112, in which a pair of module insertion/extraction parts 113 is formed to vertically adjoin together. A pair of power supply units 140 is placed at the center position in plan view, which communicates with a pair of module insertion/extraction parts 113, in proximity to the rear opening of the enclosure housing 110. Two pairs of cooling fans 150 are separately placed on the left side and the right side of the power supply units 140 vertically adjoining together at the predetermined positions communicating with the module insertion/extraction parts 113 vertically adjoining together in proximity to the rear opening 112 of the enclosure housing 110 such that each pair of cooling fans 150 is interposed between a pair of a lower rear opening 114 and an upper rear opening 115 (which form a lower part and an upper part of the rear opening 112).

FIG. 1 shows a right-side lower server module 120 within a pair of lower server modules 120 and a left-side upper server module 130 within a pair of upper server modules 130. The lower server module 120 is movable in front-rear directions and installed in the lower module insertion/extraction part 113 in the enclosure housing 110 in an insertable/removable manner in connection with the lower power supply unit 140. The lower interface unit 123 is attached to the rear end of the lower server module 120. The lower interface unit 123 is retractably inserted into the lower rear opening 114 when the lower server module 120 is installed in the lower module insertion/extraction part 113 in an insertable/removable manner. The upper server module 130 is movable in front-rear directions and installed in the upper module deck 113 in the enclosure housing 110 in an insertable/removable manner in connection with the upper power supply unit 140. The upper interface unit 133 is attached to the rear end of the upper server module 130. The upper interface unit 133 is retractably inserted into the upper rear opening 115 when the upper server module 130 is installed in the upper module insertion/extraction part 113 in an insertable/removable manner.

As described above, the server enclosure 100 includes a pair of module insertion/extraction part 113 vertically adjoining together, wherein two pairs of cooling fans 150 are placed at the predetermined positions, communicating with a pair of module insertion/extraction parts 113, in proximity to the rear opening 112 of the enclosure housing 110 via a pair of lower rear openings 114 and a pair of upper rear openings 115. Additionally, the lower interface unit 123 is attached to the rear end of the lower server module 120 and retractably inserted into the lower rear opening 114 when the lower server module 120 is moved in front-rear directions and installed in the lower module insertion/extraction part 113 in an insertable/removable manner. Moreover, the upper interface unit 133 is attached to the rear end of the lower server module 130 and retractably inserted into the upper rear opening 115 when the lower server module 130 is moved in front-rear directions and installed in the upper module insertion/extraction part 113 in an insertable/removable manner.

In short, the server enclosure of the first embodiment is designed such that the power supply unit 140 and the cooling fans 150 may not fully occupy the entire area of the rear opening 112 of the server enclosure 100 while the lower interface unit 123 of the lower server module 120 and the upper interface unit 133 of the upper server module 130 are respectively inserted into the lower rear opening 114 and the upper rear opening 115 which are positioned below or above the cooling fans 150. This allows users (or operators) to connect external wires to the lower interface unit 123 and the upper interface unit 133 in the rear side of the server enclosure 100. Thus, it is possible to collectively aggregate external wires, connected to the lower interface module 123 of the lower server module 120 and the upper interface module 133 of the upper module server 130 installed in the module insertion/extraction parts 113 in the server enclosure 100. Additionally, it is possible to improve workability (or maintainability) in the front side of the server enclosure 100 because the lower server module 120 and the upper server module 130 can be easily extracted from the front side of the server enclosure 100, and it is possible to certainly prevent external wires from hindering workability in the front side of the server enclosure 100.

Figure 7:
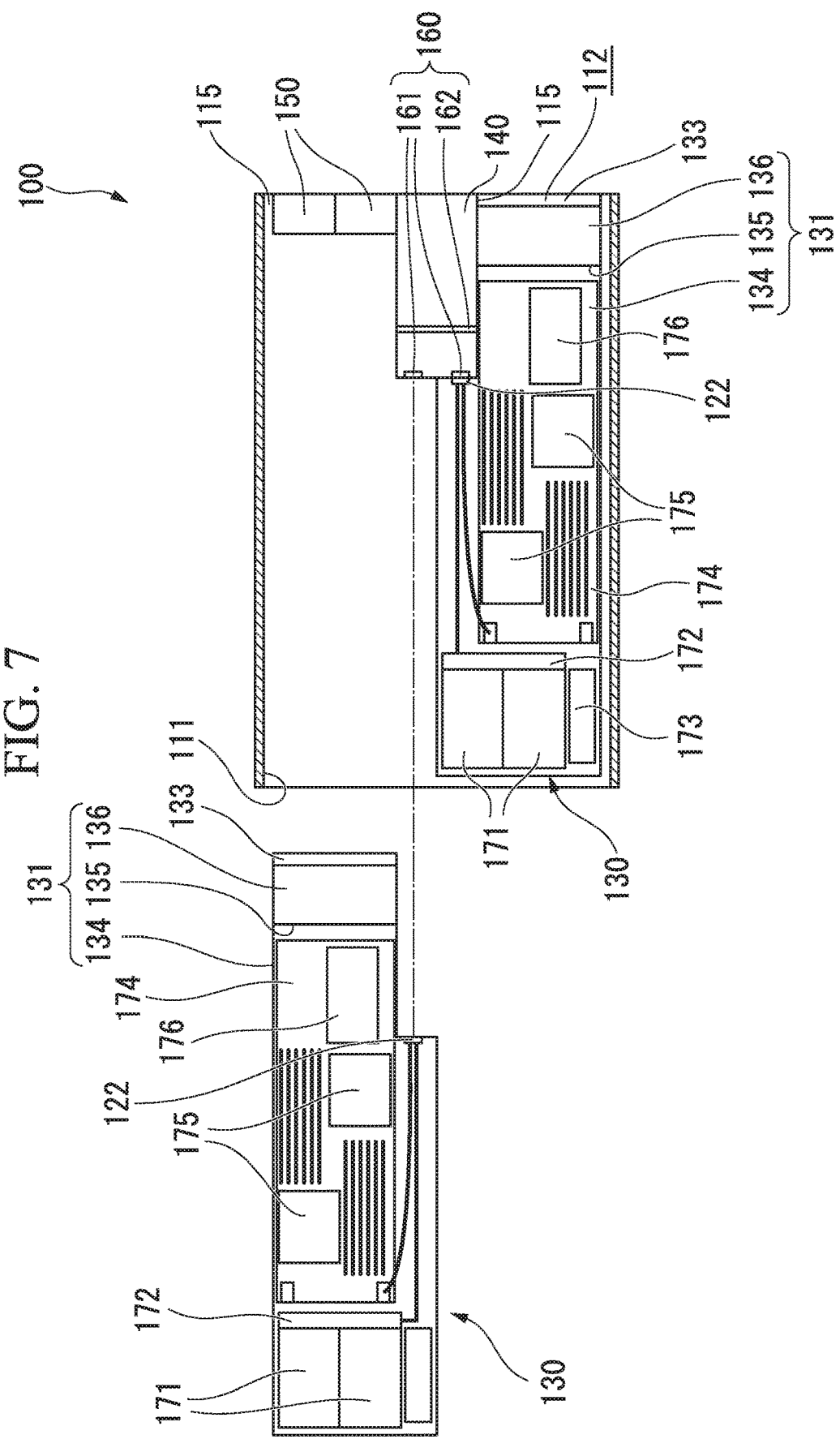
FIG. 7 is a plan view of the upper stage of the server enclosure 100 in which a right-side upper server module is installed in the module insertion/extraction part while a left-side upper server module is extracted from the enclosure housing.

As described above, the power supply units 140 are positioned in the rear end of the enclosure housing 110 while the lower server module 120 and the upper server module 130 are removably inserted into the front opening 111 of the enclosure housing 110. As shown in FIGS. 1 and 7, it is possible to easily carry out maintenance work by extracting the lower server module 120 or the upper server module 130 from the server enclosure 100. The first embodiment does not arrange power supply units respectively applied to the lower server module 120 and the upper server module 130, and therefore the layout of the server module 100 does not reduce the effective areas of the server modules 120 and 130. In other words, the first embodiment may adopt the large-sized power supply units 140 shared by the lower server modules 120 and the upper server modules 130.

2. Second Embodiment

Figure 3:
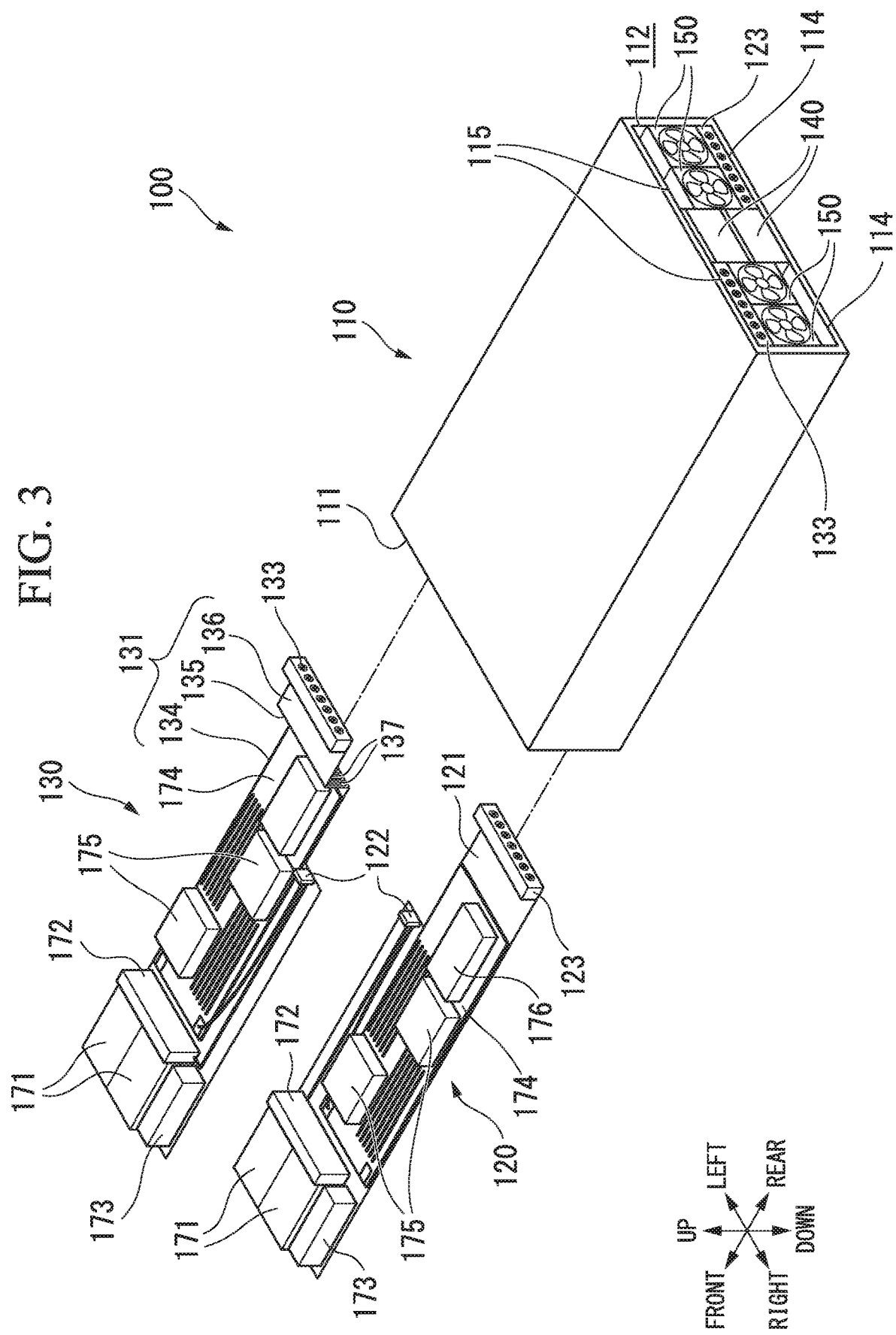
FIG. 3 is an exploded perspective view of the server enclosure according to the second embodiment of the present invention in a different viewing angle.
Figure 5:
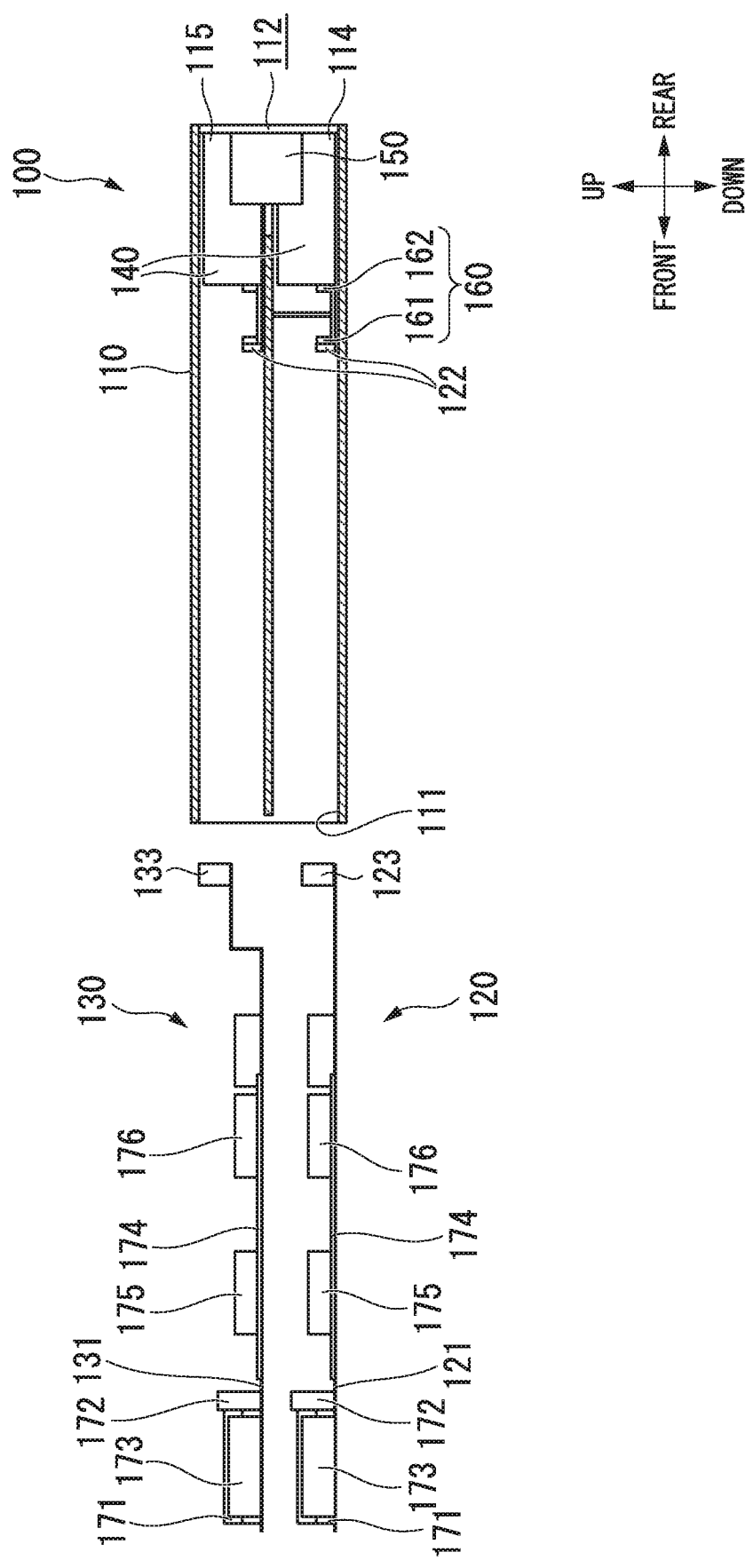
FIG. 5 is a cross-sectional view of the server enclosure precluding a pair of server modules vertically adjoining together which is extracted from the enclosure housing.
Figure 6:
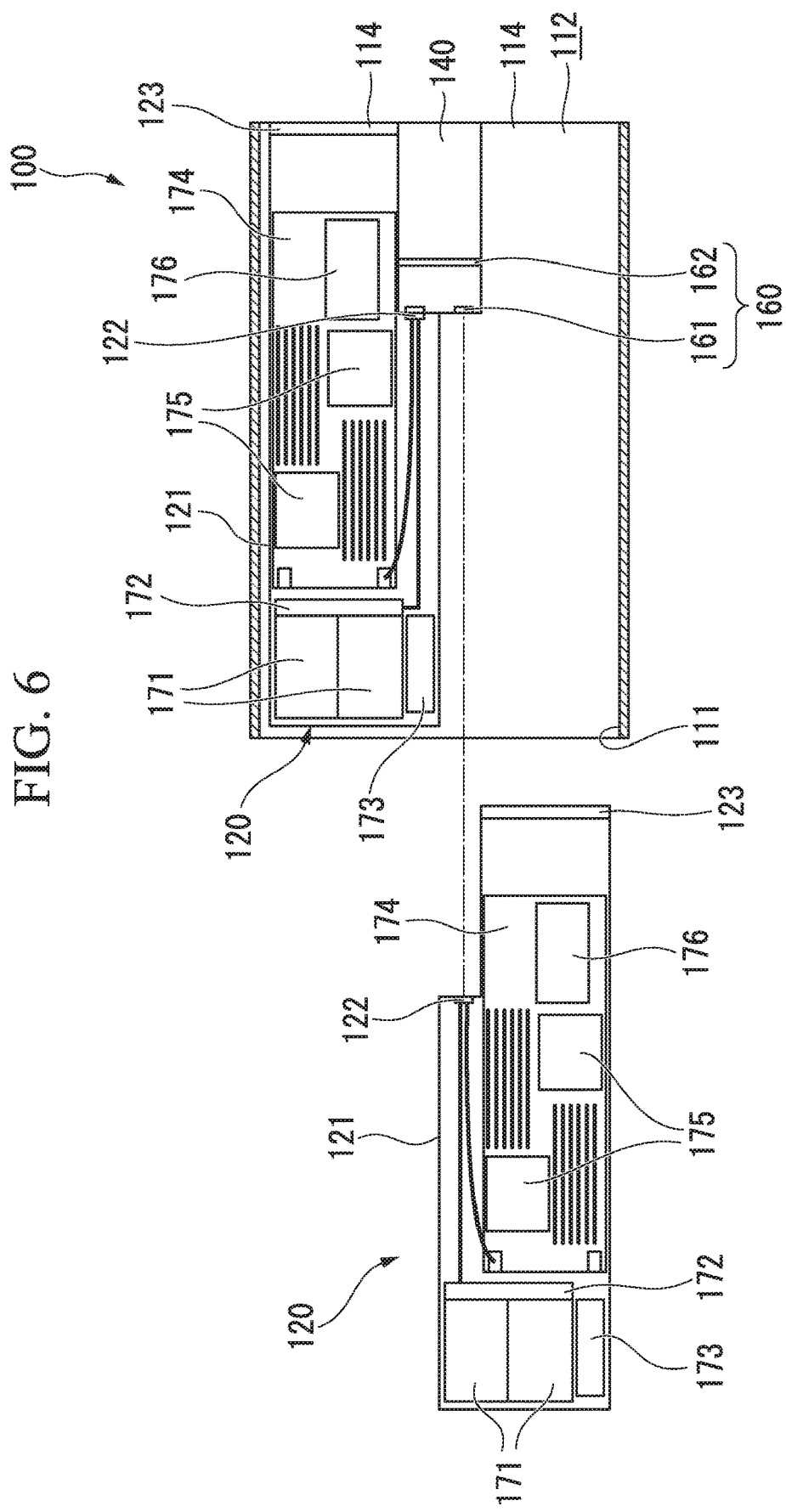
FIG. 6 is a plan view of the lower stage of the server enclosure in which a left-side lower server module is installed in the module insertion/extraction part while a right-side lower server module is extracted from the enclosure housing.
Figure 8:
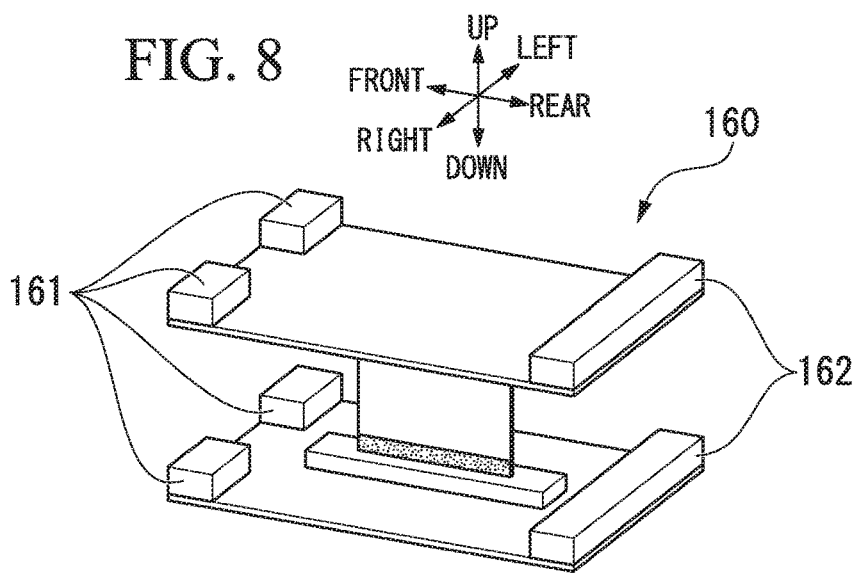
FIG. 8 is a perspective view of a power distribution unit serving as a redundant power transmitter adapted the server enclosure.
Figure 9:
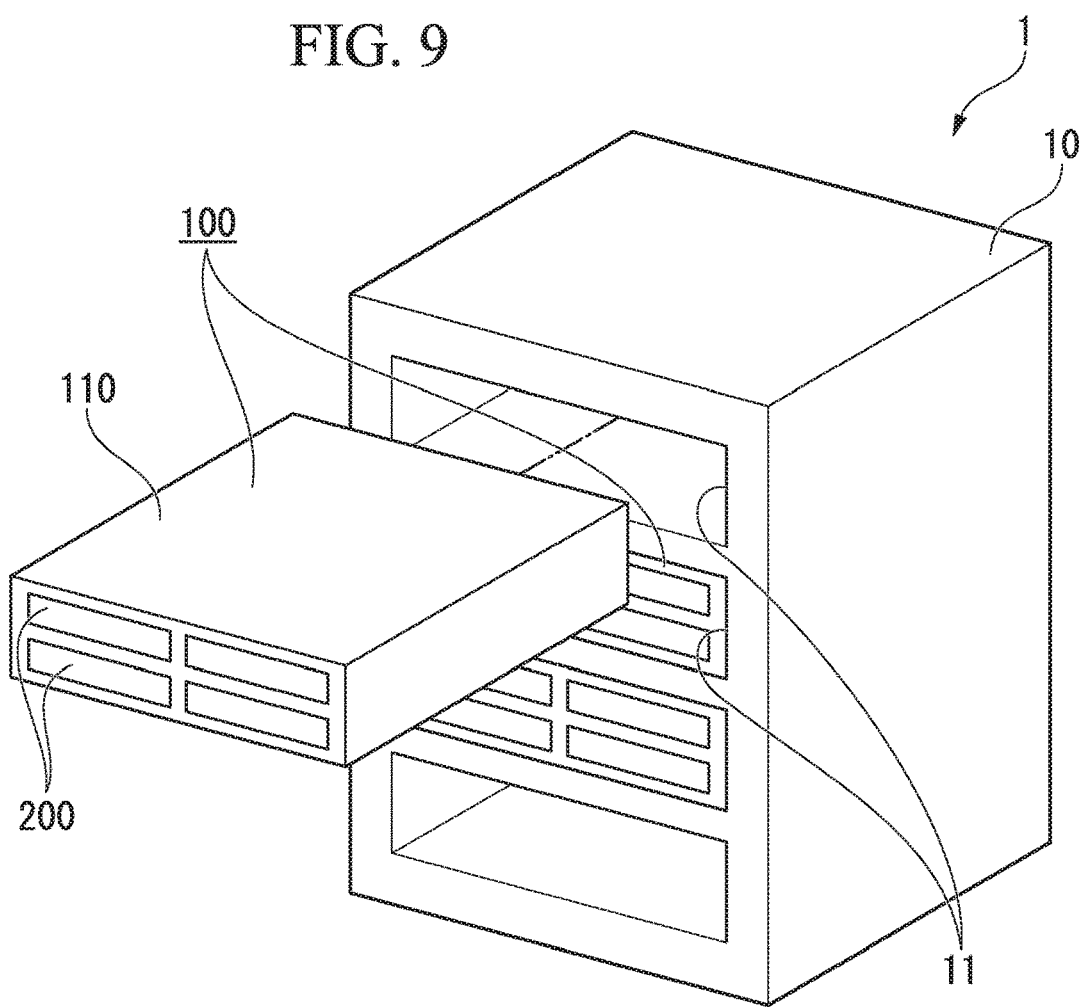
FIG. 9 is an exploded perspective view of a high-density server with a server rack accommodating a plurality of server enclosures.

Next, a second embodiment of the present invention will be described with reference to FIGS. 2 to 9, wherein parts identical to those shown in FIG. 1 are specified using the same reference signs; hence, descriptions thereof will be omitted. FIG. 2 is an exploded perspective view of the server enclosure 100 according to the second embodiment, including a pair of module insertion/extraction parts 113 accommodating two pairs of server modules 120 and 130 horizontally and vertically adjoining together. FIG. 3 is an exploded perspective view of the server enclosure 100 according to the second embodiment in a different viewing angle. FIG. 4 is a cross-sectional view of the server enclosure 100 including a pair of server modules 120, 130 installed in a pair of module s 113 vertically adjoining together in the enclosure housing 110. FIG. 5 is a cross-sectional view of the server enclosure 100 precluding a pair of server modules 120, 130 which are extracted from the enclosure housing 110. FIG. 6 is a plan view of the lower stage of the server enclosure 100 in which a left-side lower server module 120 is installed in the lower module insertion/extraction part 113 while a right-side lower server module 120 is extracted from the enclosure housing 110. FIG. 7 is a plan view of the upper stage of the server enclosure 100 in which a right-side upper server module 130 is installed in the upper module insertion/extraction part 113 while a left-side upper server module 130 is extracted from the enclosure housing 110. FIG. 8 is a perspective view of a power distribution unit 160 serving as a redundant power transmitter adapted the server enclosure 100. FIG. 9 is an exploded perspective view of a high-density server 1 with a server rack 10 accommodating a plurality of server enclosures 100.

Similar to the server enclosure 100 of the first embodiment shown in FIG. 1, the server enclosure 100 of the second embodiment shown in FIG. 2 includes the enclosure housing 110, a pair of power supply units 140, two pairs of cooling fans 150, a pair of lower server modules 120 with a pair of lower interface units 123, and a pair of upper server modules 130 with a pair of upper interface units 133. As shown in FIG. 9, the high-density server 1 has a server rack 10 including a plurality of enclosure insertion/extraction parts 11 vertically adjoining together, each of which accommodates the server enclosure 100 in an insertable/removable manner.

As shown in FIGS. 2 to 7, the enclosure housing 110 of the server enclosure 100 includes a pair of lower server modules 120 and a pair of upper server modules 130. The enclosure housing 110 is formed in a flat box shape with the front opening 111 and the rear opening 112. A pair of module insertion/extraction parts 113 vertically adjoining together is formed inside the enclosure housing 110. Additionally, a pair of power source units 140 vertically adjoining together, two pairs of cooling fans 150 horizontally aligned, and the power distribution unit 160 serving as a single redundant power transmitter are arranged inside the enclosure housing 110. A pair of power source units 140 is placed at the center position in plan view, communicating with a pair of module insertion/extraction parts 113 vertically adjoining together, in proximity to the rear opening 112 of the enclosure housing 110.

As shown in FIGS. 2 and 8, the power distribution unit 160 is formed such that a pair of printed circuit boards horizontally positioned is spaced from each other and connected together via another printed circuit board vertically positioned. Two pairs of front connectors 161 are respectively attached to the front ends in a pair of printed circuit boards while a pair of rear connectors 162 is attached to the rear ends in a pair of printed circuit boards. That is, the power distribution unit 160 establishes redundant multipoint-to-multipoint connections between two pairs of front connectors 161 horizontally and vertically adjoining together and a pair of rear connectors 162 vertically adjoining together.

As shown in FIGS. 3 to 5, two pairs of cooling fans 150 are placed at the predetermined positions, communicating with a pair of module insertion/extraction parts 113 vertically adjoining together, in the left side and the right side of the power source units 140 vertically adjoining together in proximity to the rear opening 112 of the enclosure housing 110, wherein they are interposed between the lower rear openings 114 and the upper rear openings 115 in the rear opening 112 of the enclosure 110. As shown in FIG. 2 and FIGS. 4 to 6, a pair of lower server modules 120 is installed in the lower module insertion/extraction part 113 in the enclosure housing 110 in an insertable/removable manner.

As shown in FIGS. 2 to 6, the lower server module 120 includes a module tray 121, a connector 122, and the lower interface unit 123. Additionally, the lower server module 120 includes a pair of HDD units 171, an HDD connector 172, an operation panel 173, a motherboard 174, a plurality of computer units 175, and an option unit 176 (which may implement various optional functions). The module tray 121 has a flat board shape which can be removably inserted into the front opening 111 along the module insertion/extraction part 113 of the enclosure housing 110. A pair of module trays 121 having horizontally symmetrical shapes is prepared in connection with a pair of lower server modules 120 which are installed in the lower module insertion/extraction part 113 in the enclosure housing 110. The module tray 121 is equipped with the foregoing components 122, 123, 171 to 174 on the upper surface thereof. Additionally, a plurality of computer units 175 and the option units 176 are mounted on the upper surface of the module tray 121. The motherboard 174 is configured of a printed circuit board. A pair of motherboards 174 having the same structure is applied to a pair of lower server modules 120 having horizontally symmetrical shapes.

A pair of HDD units 171 horizontally adjoining together is attached to the front end of the module tray 121 and detachably connected to the HDD connector 172 which is positioned in the rear side of the HDD units 171 and which is electrically connected to the connector 122. The operation panel 173 is placed in the side of the HDD units 171 and connected to various components (not shown) as necessary. A pair of cooling fans 150 horizontally adjoining together is placed in the rear side of the enclosure housing 110 distanced from the HDD connector 172. The computer unit 175 is configured of a single-chip microcomputer including a CPU, while the option unit 176 is configured of a disk controller. The right-side lower server module 120 is equipped with the connector 122 which is attached to the left end of the center corner thereof, while the left-side lower server module 120 is equipped with the connector 122 which is attached to the right end of the center corner thereof. The connector 122 is electrically connected to the HDD connector 172 and the motherboard 174. When the lower server module 120 is inserted into the front opening 111 along the lower module insertion/extraction part 113 in the enclosure housing 110, the connector 122 is connected to one of four front connectors 161 which are attached to the front ends of the power distribution unit 160. Thus, the lower server module 120 installed in the module insertion/extraction part 113 is subjected to redundant multipoint-to-multipoint connections with a pair of power source units 140 vertically adjoining together by way of the power distribution unit 160.

As shown in FIGS. 3, 4, and 6 in which the lower server module 120 is installed in the lower module insertion/extraction part 113 in the enclosure housing 110, the lower interface unit 123 is inserted into the lower rear opening 114, which is arranged in the left side or the right side of the power source units 140 vertically adjoining together and placed below a pair of cooling fans 150 in the rear opening 112 of the enclosure housing 110. As shown in FIGS. 2, 4, 5, and 7, a pair of upper server modules 130 horizontally adjoining together is moved in front-rear directions and installed in the upper module insertion/extraction part 113 in the enclosure housing 110 in an inserable/removable manner. Similar to the lower server module 120, as shown in FIGS. 2 to 6, the upper server module 130 includes a module tray 131, a pair of HDD units 171, a HDD connector 172, an operation panel 173, a motherboard 174, a plurality of computer units 175, and an option unit 176 as well as a connector 122 and an upper interface unit 133. Similar to a pair of lower server modules 120, a pair of upper server modules 130 is moved in front-rear directions and installed in the upper module insertion/extraction part 113 in the enclosure housing 110 in an insertable/removable manner. A pair of upper server modules 130 is subjected to redundant multipoint-to-multipoint connections with a pair of power source units 140 vertically adjoining together. The module tray 131 has a main part 134 which is horizontally placed to mount the HDD connector 172 and the motherboard 174 thereon. The upper server module 130 differs from the lower server module 120 in that the main part 134 is furnished with a module-standing rear part 135 and a module-extended rear part 136. The module-standing rear part 135 is vertically disposed on the rear end of the main part 134, while the module-extended rear part 136 is extended from the upper end of the module-standing rear part 135 and extended horizontally in the rear direction. Compared to the module tray 121 furnished with a main part alone, the module tray 131 is formed in a bent shape with the main part 134, the module-standing rear part 135, and the module-extended rear part 136. The upper interface unit 133 is attached to the rear end of the module-extended rear part 136 of the module tray 131. Thus, the upper interface unit 133 is moved in front-rear directions and retractably inserted into the upper rear opening 115 when the upper server module 130 is installed in the upper module insertion/extraction part 113 of the enclosure housing 110 in an insertable/removable manner.

When the upper server module 130 is installed in the upper module insertion/extraction part 113, the module-standing rear part 135 is vertically disposed in the rear side and positioned in front of the cooling fans 150 in the enclosure housing 110. As shown in FIGS. 2 and 3, a ventilation hole 137, i.e. a plurality of vertical slits, is formed and horizontally aligned in the module-standing rear part 135 of the server tray 131 of the upper server module 130, thus allowing cooling air to flow therethrough. Thus, the HDD units 171 and the computer units 175 mounted on the main part 134 of the module tray 131 may communicate with the upper interface unit 133, attached to the rear end of the module-extended rear part 136 of the module tray 131, via the ventilation hole 137 running through the module-standing rear part 135 of the module tray 131 in the upper server module 130.

As shown in FIG. 9, the high-density server 1 of the second embodiment accommodates four server enclosures 100 which are mounted on four enclosure insertion/extraction parts 11 in the server rack 10 in an insertable/removable manner. Each of four server enclosures 100 may accommodate two pairs of server modules 120, 130 horizontally and vertically adjoining together, which are installed in a pair of module insertion/extraction parts 113 in an insertable/removable manner as shown in FIGS. 2 to 7. The high-density server 1 is able to perform complex computation and parallel processing with a plurality of server modules 120, 130 installed in the enclosure insertion/extraction parts 11 in the server rack 10.

As described above, the server enclosure 100 includes a pair of module insertion/extraction parts 113 vertically adjoining together in the enclosure housing 110, wherein two pairs of cooling fans 150 are placed at the predetermined positions, communicating with a pair of module insertion/extraction parts 113, inside the rear opening 112 of the enclosure housing 110 with a pair of lower rear openings 114 therebelow and a pair of upper rear openings 115 thereabove. Additionally, the lower interface unit 123 attached to the rear end of the module tray 121 is retractively inserted into the lower rear opening 114 when the lower server module 120 is moved in front-rear directions and installed in the lower module insertion/extraction part 113 in the enclosure housing 110. Moreover, the upper interface unit 133 attached to the rear end of the module tray 131 is retractively inserted into the upper rear opening 115 when the upper server module 130 is moved in front-rear directions and installed in the upper module insertion/extraction part 113 in the enclosure housing 110.

Thus, the server enclosure 100 of the second embodiment is designed such that the power supply units 140 and the cooling fans 150 may not fully occupy the entire area of the rear opening 112 of the server enclosure 100 while the lower interface unit 123 and the upper interface unit 133 are inserted into the lower rear opening 114 and the upper rear opening 115 formed below and above the cooling fans 150. This allows users to connect external wires to the lower interface unit 123 and the upper interface unit 133 in the rear side of the enclosure housing 110. In other words, it is possible to collectively aggregate external wires, connected to the lower interface unit 123 and the upper interface unit 133 in the server modules 120 and 130 which are inserted into the enclosure housing 110, in the rear side of the server enclosure 100.

As described above, it is possible to arrange the HDD units 171 and the operation panels 173 in the front side of the server enclosure 100, and it is possible to extract the lower server module 120 and the upper server module 130 from the server enclosure 100. Additionally, it is possible to improve workability in the front side of the server enclosure 100, and it is possible to reliably prevent external wires from hindering workability with the server enclosure 100. The present embodiment does not cause a mess in the front side of the server enclosure 100, and therefore it is possible to prevent external wires from hindering user's access to the HDD unit 171 and the operation panel 173 in the front side of the server enclosure.

It is necessary for the server enclosure 100 of the second embodiment to arrange the module-standing rear part 135 of the module tray 131 of the upper server module 130 in front of the cooling fans 150 inside the enclosure housing 110. The ventilation hole 137 is formed to run through the module-standing rear part 135 of the module tray 131, wherein ventilation air produced by the cooling fans 150 may pass through the ventilation hole 137 of the module-standing rear part 135 of the module tray 131 to reach the HDD units 171 and the motherboard 174; hence, it is possible to appropriately cool these components causing heat on the module tray 131 of the upper server module 130. In particular, the ventilation hole 137, i.e. a plurality of vertical slits, is horizontally aligned to run through the module-standing rear part 135 of the module tray 131; hence, it is possible to secure ventilation between the upper interface unit 133 and the foregoing components (e.g. the HDD units 171 and the computer units 175) via the ventilation hole 137 running through the module-standing rear part 135 of the module tray 131 of the upper server module 130.

The server enclosure 100 of the second embodiment is advantageous in that it is possible to easily perform maintenance work on the HDD units 171 while the server modules 120 and 130 remain inside the enclosure housing 110. Additionally, the power source units 140 are positioned I the rear end of the enclosure housing 110, while the server modules 120, 130 are inserted into the front opening 111 and installed inside the enclosure housing 110 in an insertable/removable manner. As shown in FIGS. 2 and 7, it is possible to easily extract the server modules 120, 130 from the enclosure housing 110, thus carrying out maintenance work on the server modules 120, 130. Moreover, it is possible to prevent the power source units 140 from reducing the effective areas of the server modules 120, 130 because the power source units 140 are not individually assigned to the server modules 120, 130 installed in the server enclosure 100. For this reason, it is possible to arrange large-sized power source units 140 shared by a plurality of server modules 120, 130.

In particular, the server enclosure 100 of the second embodiment is characterized by that the power distribution unit 160 establishes redundant multipoint-to-multipoint connections between two pairs of server modules 120, 130 horizontally and vertically adjoining together and a pair of power source units 140 vertically adjoining together. Even when electrical failure occurs partly on two pairs of serer modules 120, 130 or partly on a pair of power source units 140, it is possible to prevent the server enclosure 100 from being entirely stopped in operation. Additionally, a pair of lower server modules 120 is furnished with a pair of module trays 121 having horizontally symmetrical shapes, while a pair of upper server modules 130 is furnished with a pair of module trays 131 having horizontally symmetrical shapes. In contrast, both the module trays 121 and 131 are equipped with the motherboards 174 having the same layout for mounting the computer units 175 and the option unit 176 thereon. In other words, the second embodiment is advantageous in that a plurality of server modules 120, 130 having symmetrical shapes may adopt the standardized motherboard 174 mounting the computer units 175 and the option unit 176 thereon; hence, it is possible to improve productivity in manufacturing the server enclosure 100.

Figure 10:
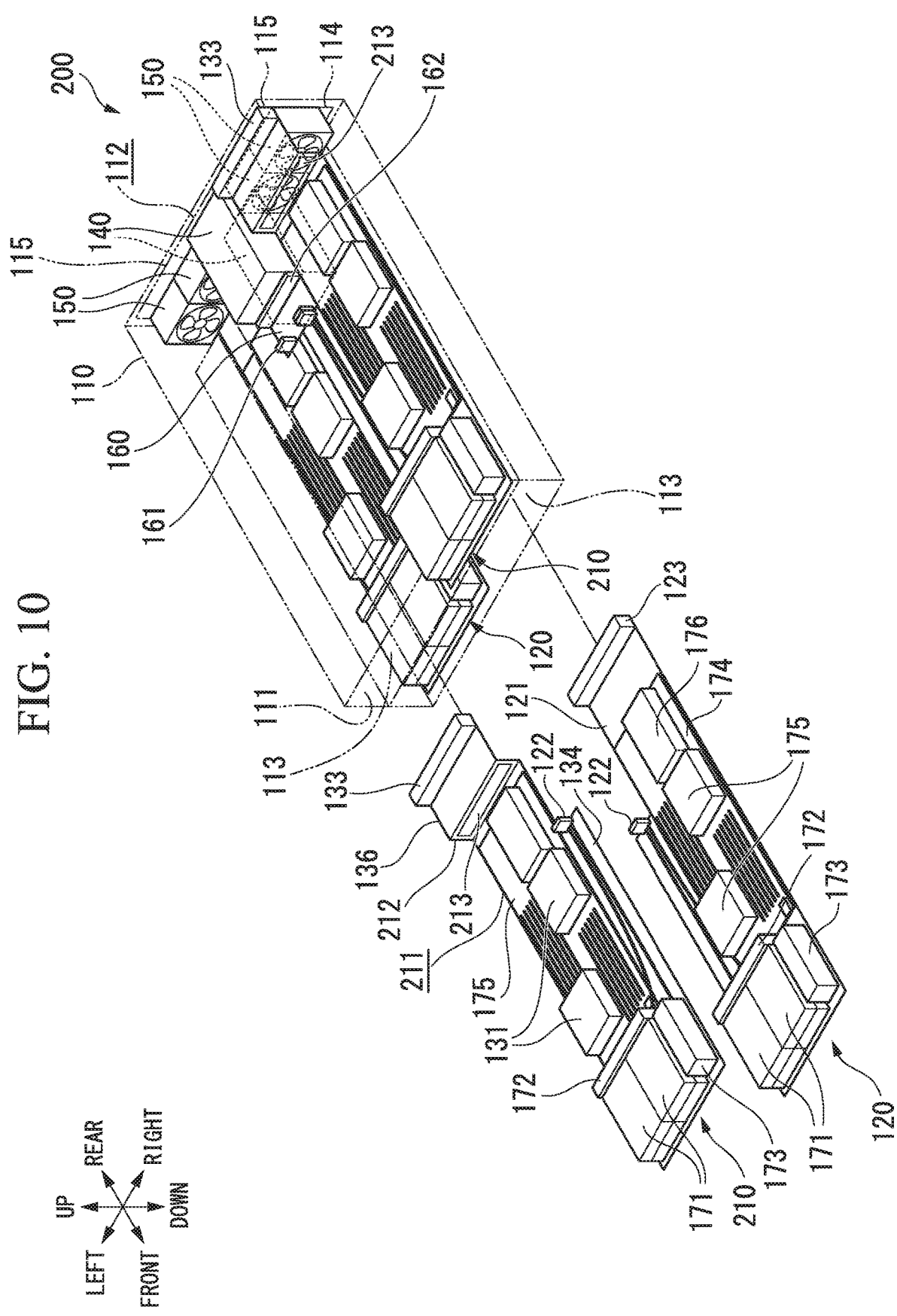
FIG. 10 is an exploded perspective view of a server enclosure according to a variation of the second embodiment of the present invention.

It is possible to modify the server enclosure 100 of the second embodiment in which the ventilation hole 137, i.e. a plurality of vertical slits horizontally aligned together, is formed to run through the module-standing rear part 135 of the module tray 131 in the upper server module 130. FIG. 10 shows a variation of the second embodiment, exhibiting a server enclosure 200 in which parts identical to those shown in FIG. 2 are specified using the same reference signs. Compared to the server enclosure 100 shown in FIG. 2, the server enclosure 200 shown in FIG. 10 is characterized by replacing the upper server module 130 with an upper server module 210. The upper server module 210 includes a server tray 211 (corresponding to the main part 134 of the module tray 131) and a module-standing rear part 212 (corresponding to the module-standing rear part 135 of the module tray 131) as well as the module-extended rear part 136. A ventilation hole 213 having a wide rectangular shape is formed to run through the module-standing rear part 212 of the server tray 211. This variation is advantageous in that the large-sized ventilation hole 213 conveys ventilation air, produced by the cooling fans 150, directly to the HDD units 171 and the motherboard 174 so as to efficiently cool these components even though it may not easily establish wiring between the upper interface unit 133 and the foregoing components (e.g. the HDD units 171 and the computer units 175). In short, it is up to users to select the optimum of the two types of the upper server modules 130 and 210 having merits and demerits in consideration of requirements such as cooling performance and wiring layouts. Additionally, the ventilation hole can be formed in various shapes; for example, it is possible to form plenty of small apertures which are arranged in a matrix form consisting of columns and rows (not shown).

As shown in FIG. 9, the high-density server 1 includes four enclosure insertion/extraction parts 11 vertically aligned in the server rack 10, wherein four server enclosures 100, each including two pairs of server modules horizontally and vertically adjoining together, can be installed in the four enclosure insertion/extraction parts 11. Of course, it is possible to arbitrarily change the numbers, dimensions, and layouts within the foregoing requirements of the second embodiment.

3. Third Embodiment

Figure 11:
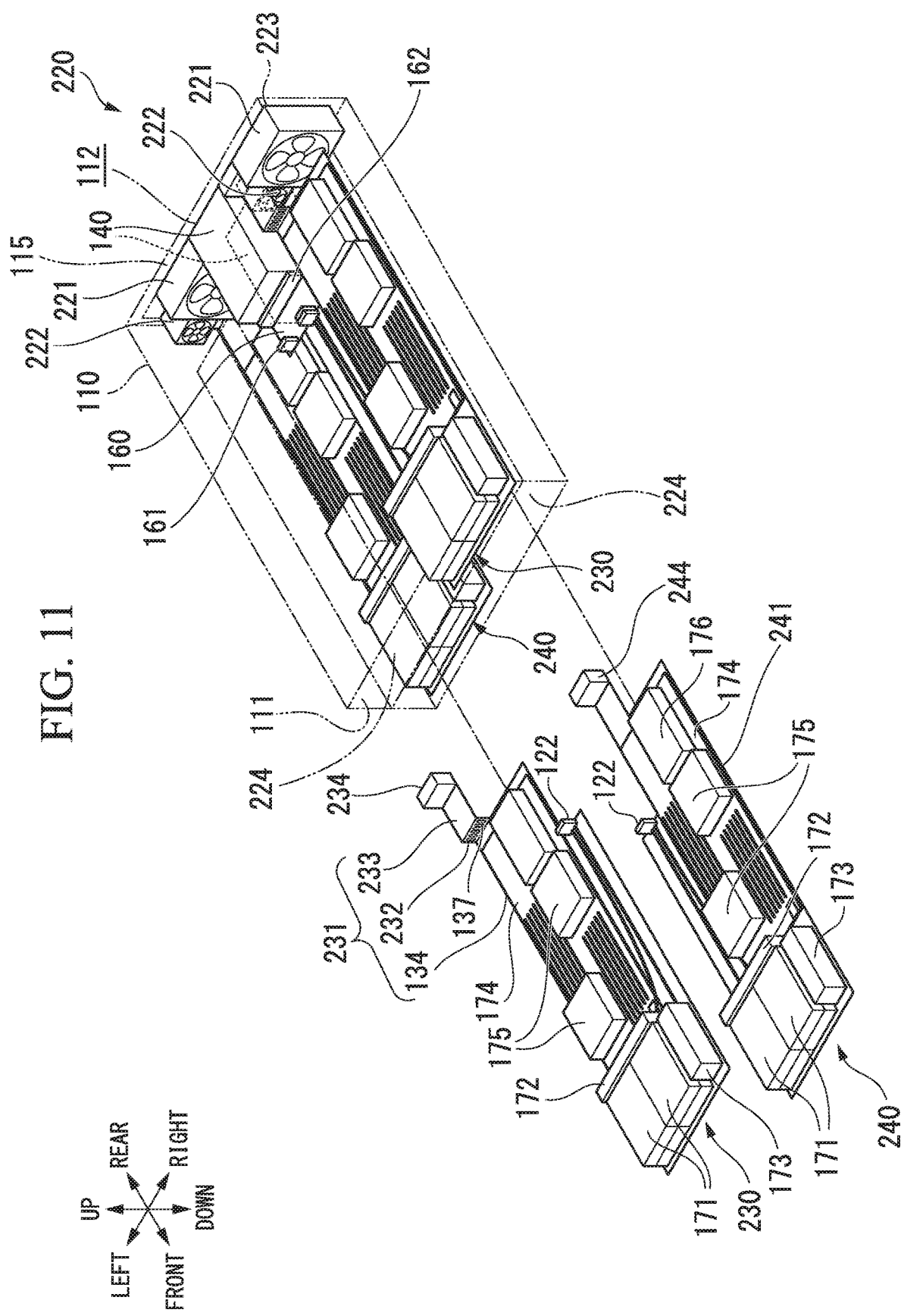
FIG. 11 is an exploded perspective view of a server enclosure with an enclosure housing accommodating two pairs of server modules according to a third embodiment of the present invention.
Figure 12:
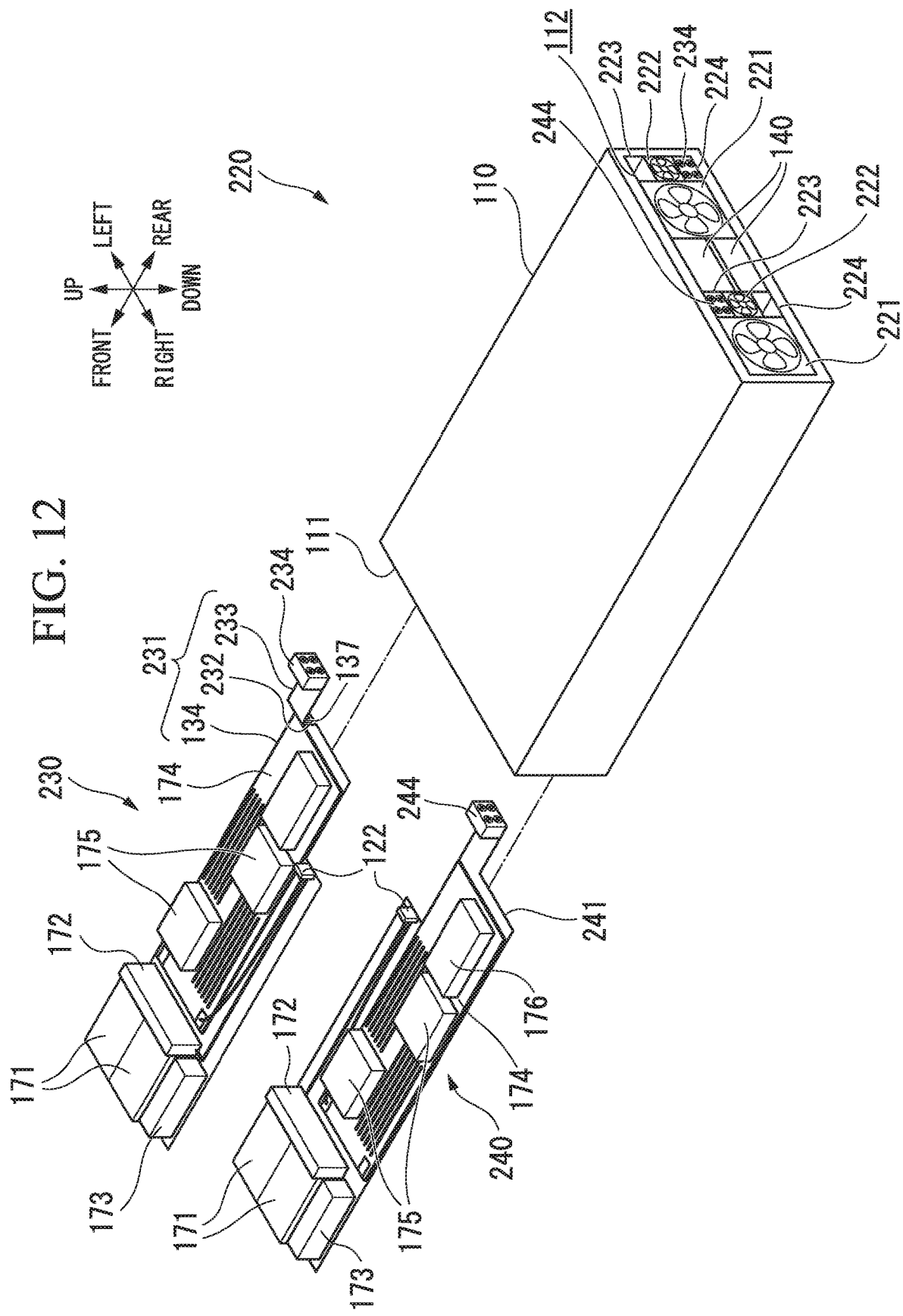
FIG. 12 is an exploded perspective view of the server enclosure according to the third embodiment of the present invention in a different viewing angle.

Next, a server enclosure 220 according to a third embodiment of the present invention will be described with reference to FIGS. 11 and 12, in which parts identical to those shown in FIGS. 1 to 7 are specified using the same reference signs. FIG. 11 is an exploded perspective view of the server enclosure 220, while FIG. 12 is an exploded perspective view of the server module 220 in a different viewing angle. Similar to the server enclosures 100 according to the first and second embodiments, the server enclosure 220 according to the third embodiment has the enclosure housing 110 with a pair of module insertion/extraction parts 113 accommodating two pairs of server modules 230, 240 horizontally and vertically adjoining together.

The server enclosure 220 includes two pairs of cooling fans 221, 222 separately arranged in the left side and the right side of a pair of power source units 140, which vertically adjoin together at the center position in plan view, in proximity to the rear opening 112 of the enclosure housing 110. Specifically, a pair of a large-sized cooling fan 221 and a small-size cooling fan 222 is arranged in each of the left and right sides of the power source units 140, wherein the small-size cooling fan 222 is interposed between an upper rear opening 223 and a lower rear opening 224 in the rear opening 112 of the enclosure housing 110. The upper server module 230 includes a module tray 231, which further includes the main part 134, a module-standing rear part 232 (corresponding to the module-standing rear part 135 of the module tray 131), and a module-extended rear part 233 (corresponding to the module-extended rear part 136 of the module tray 131), as well as an upper interface unit 234 (corresponding to the upper interface unit 133). Compared with the module tray 131, the module tray 231 is approximately halved in width, leaving the left part thereof. The lower server module 240 includes a module tray 241 and a lower interface unit 244. Compared to the lower server module 120, the rear part of the module tray 241 and the lower interface unit 244 are approximately halved in width, leaving the left part thereof.

As described above, two pairs of the large-sized cooling fan 221 and the small-size cooling fan 222 are separately arranged in the left side and the right side of the power source units 140 vertically aligned together in proximity to the rear opening 112 of the enclosure housing 110, wherein the small-size cooling fan 222 is interposed between the upper rear opening 223 and the lower rear opening 224. The lower interface unit 244 (which is attached to the left-side rear end of the module tray 241 halved in width) is moved in front-rear directions and retractively inserted into the lower rear opening 224 (which is formed below the small-size cooling fan 222) when the lower server module 240 is installed in the lower module insertion/extraction part 113 inside the enclosure housing 110 in an insertable/removable manner. Similarly, the upper interface unit 234 (which is attached to the left-side rear end of the module tray 231 halved in width) is moved in front-rear directions and retractively inserted into the upper rear opening 223 (which is formed above the small-size cooling fan 222) when the upper server module 230 is installed in the upper module insertion/extraction part 113 inside the enclosure housing 110 in an insertable/removable manner.

The server enclosure 220 of the third embodiment allows users to connect external wires to the upper interface unit 234 and the lower interface unit 244 in the rear side of the enclosure housing 110. Additionally, the HDD units 171 and the operation panels 173 are arranged in the front sides of the server modules 230, 240 which can be easily extracted from the enclosure housing 110. Thus, it is possible to improve workability in the front side of the server enclosure 220, and it is possible to reliably prevent external wires from hindering users working on the server modules 230, 240. The server enclosure 220 adopts the large-sized cooling fans 221 which can directly cool the server modules 230, 240. The server enclosure 220 of the third embodiment is designed to improve productivity in manufacturing the server modules 230, 240 because a pair of upper server modules 230 employs the same structure while a pair of lower server modules 240 employs the same structure.

As described above, the server enclosure 220 of the third embodiment is designed in a horizontally asymmetrical manner such that a pair of upper server modules 230 having the same structure is asymmetrical to a pair of lower server modules 240 having the same structure in connection with two pairs of cooling fans 221, 222 having different sizes which are positioned adjacently and linearly aligned together. However, it is possible to redesign the server enclosure 220 in a horizontally symmetrical manner by symmetrically aligning two pairs of cooling fans 221, 222, wherein it is necessary to redesign a pair of upper server enclosures 230 having symmetrical shapes and a pair of lower server modules 240 having symmetrical shapes.

4. Fourth Embodiment

Figure 13:
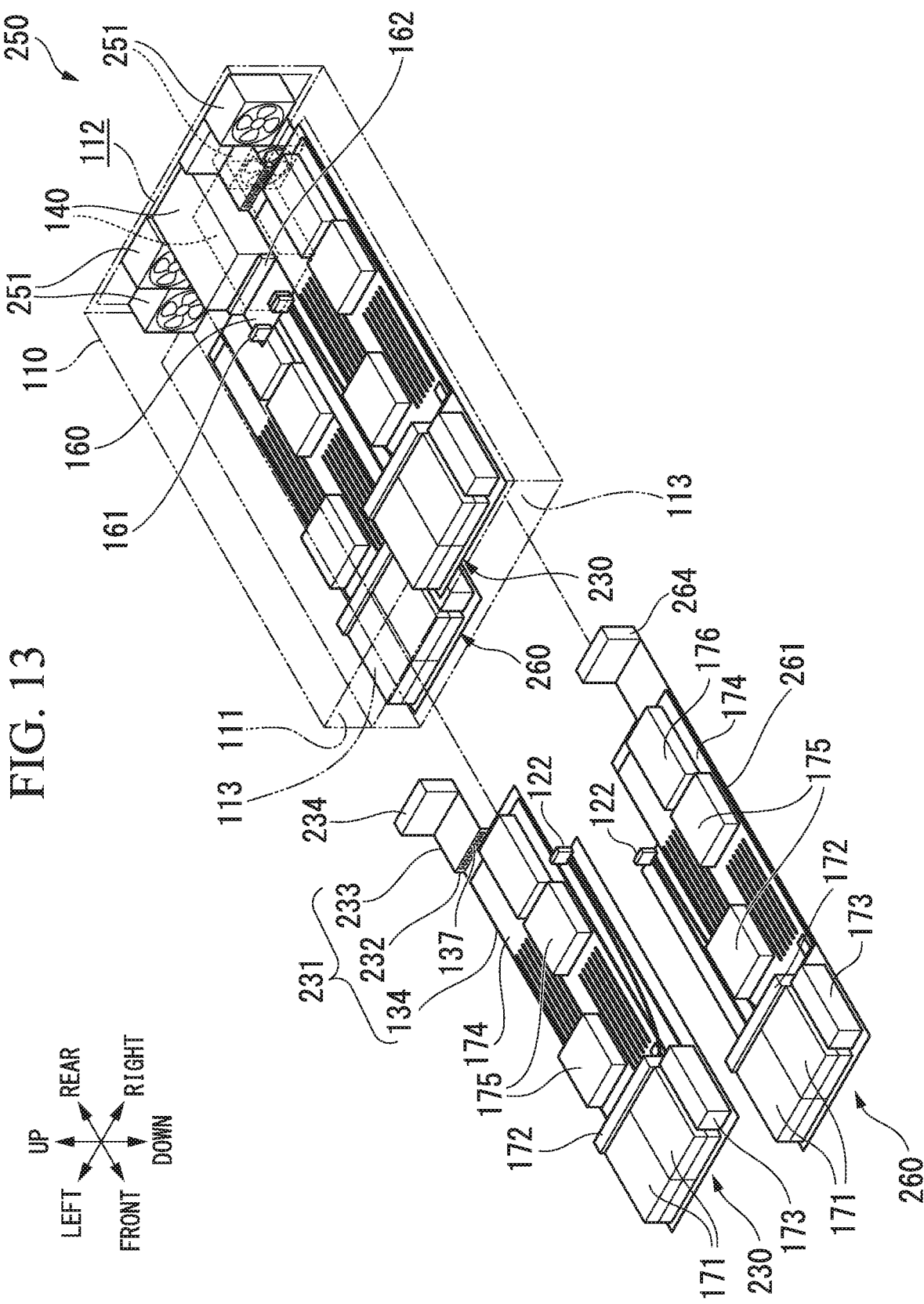
FIG. 13 is an exploded perspective view of a server enclosure with an enclosure housing accommodating two pairs of server modules according to a fourth embodiment of the present invention.

Next, a server enclosure 250 according to a fourth embodiment of the present invention will be described with reference to FIGS. 13 and 14. FIG. 13 is an exploded perspective view of the server enclosure 250, while FIG. 14 is an exploded perspective view of the server enclosure 250 in a different viewing angle. Similar to the server enclosures 100 and 220, the server enclosure 250 includes a pair of module insertion/extraction parts 113 accommodating two pairs of server modules 230, 260 horizontally and vertically adjoining together inside the enclosure housing 110. In the server enclosure 250, two pairs of cooling fans 251 are arranged in the left side and the right side of the power source units 140, which vertically adjoin together at the center position in plan view, in proximity to the rear opening 112 of the enclosure housing 110. A pair of cooling fans 251 having the same size is positioned differently such that one cooling fan 251 is placed at the upper position above a lower rear opening 252 while the other cooling fan 251 is placed at the lower position below an upper rear opening 253.

Similar to the server module 220 of the third embodiment, the server module 250 of the fourth embodiment adopts the upper server module 230, including the module tray 231, the module-standing rear part 232, the module-extended rear part 233, and the upper interface unit 234, with the rear part approximately halved in width, leaving the left side thereof. The server enclosure 250 adopts a lower server module 260, including a module tray 261 and a lower interface unit 264, with the rear part approximately halved in width, leaving the right side thereof.

A pair of cooling fans 251 adjoins together at different heights in each of the left and right sides of the power source units 140 such that the upper cooling fan 251 is positioned above the lower rear opening 252 while the lower cooling fan 251 is positioned below the upper rear opening 253. Thus, the lower interface unit 264 (attached to the right-side rear end of the module tray 261) is moved in front-rear directions and retractively inserted into the lower rear opening 252 when the lower server module 260 is installed in the lower module insertion/extraction part 113 inside the enclosure housing 110 in an insertable/removable manner. Similarly, the upper interface unit 234 (attached to the left-side rear end of the module tray 231) is moved in front-rear directions and retractively inserted into the upper rear opening 253 when the upper server module 230 is installed in the module insertion/extraction part 113 inside the enclosure housing 110 in an insertable/removable manner.

The server enclosure 250 of the fourth embodiment allows users to connect external wires to the upper interface unit 234 and the lower interface unit 264 in the rear side of the enclosure housing 110. Additionally, the HDD units 171 and the operation panels 173 are arranged in the front sides of the server modules 230, 260 which can be easily extracted from the enclosure housing 110. Thus, it is possible to improve workability in the front side of the server enclosure 250, and it is possible to certainly prevent external wires from hindering user's workability on the server modules 230, 260.

The server enclosure 250 of the fourth embodiment is characterized in that a pair of cooling fans 251 having the same size is vertically displaced in position so as to prepare the lower rear opening 252 and the upper rear opening 253. This may improve productivity because the cooling fans 251 can be uniformly manufactured with the same shape and the same size. Additionally, the server enclosure 250 adopts a pair of upper server modules 230 having the same shape and a pair of lower server modules 260 having the same shape. This improves productivity in manufacturing the server modules 230, 260 with the predetermined shape and size.

As described above, the server enclosure 250 of the fourth embodiment is designed in a horizontally asymmetrical manner such that a pair of upper server modules 230 having the same structure is asymmetrical to a pair of lower server modules 260 having the same structure in connection with two pairs of cooling fans 251 having the same size which are vertically displaced in position. However, it is possible to redesign the server enclosure 250 in a horizontally symmetrical manner by symmetrically aligning two pairs of cooling fans 251, wherein it is necessary to redesign a pair of upper server enclosures 230 having symmetrical shapes and a pair of lower server modules 260 having symmetrical shapes.

Lastly, the foregoing embodiments are illustrative and not restrictive; therefore, it is possible for any skilled person in the art to arbitrarily change design factors, dimensions, and arrangements with respect to the foregoing constituent elements. Thus, the present invention is not limited to the foregoing embodiments, which can be further modified in various ways within the scope of the invention as defined in the appended claims.

What is claimed is:

1. A server enclosure comprising:
   an enclosure housing including a front opening and a rear opening;
   a pair of upper server modules each having a front portion, a rear portion, and an upper interface unit, such that the rear portions of the pair of upper server modules are exposed in the rear opening of the enclosure housing when horizontally inserted into a pair of upper module insertion/extraction parts of the enclosure housing in a direction from the front opening to the rear opening, wherein the rear portions of the pair of upper server modules have a reduced width with respect to the front portions of the pair of upper server modules;
   a pair of lower server modules each having a front portion, a rear potion, and a lower interface unit, such that the rear portions of the pair of lower server modules are exposed in the rear opening of the enclosure housing when horizontally inserted into a pair of lower module insertion/extraction parts of the enclosure housing in the direction from the front opening to the rear opening, wherein the rear portions of the pair of lower server modules have a reduced width with respect to the front portions of the pair of lower server modules;
   a pair of power supply units including an upper power supply unit and a lower power supply unit, the upper power supply unit and the lower power supply unit being vertically combined together such that the upper power supply unit is disposed in an upper space formed between the rear portions of the pair of upper server modules while the lower power supply unit is disposed in a lower space formed between the rear portions of the pair of lower server modules, and
   a plurality of cooling fans disposed separately on opposite sides of the pair of power supply units,
   wherein the rear portions of the pair of upper server modules and the rear portions of the pair of lower server modules are connected to the pair of power supply units via a power distribution unit.

2. The server enclosure according to claim 1, wherein the upper interface units of the pair of upper server modules are located above the plurality of cooling fans in the rear opening of the enclosure housing while the lower interface units of the pair of lower server modules are located below the plurality of cooling fans in the rear end of the enclosure housing.

3. The server enclosure according to claim 2, wherein the rear portions of the pair of upper server modules are each elevated to locate the upper interface units of the pair of upper server modules.

4. The server enclosure according to claim 3, wherein a ventilation hole is formed to run through a module-standing part of a module tray and positioned in a front side of a cooling fan of the plurality of cooling fans which are installed in the enclosure housing.

5. The server enclosure according to claim 1, wherein the plurality of cooling fans include a first cooling fan and a second cooling fan, and the first cooling fan is larger than the second cooling fan.

6. The server enclosure according to claim 1, wherein the plurality of cooling fans comprises an upper cooling fan which is positioned in the rear opening of the enclosure housing with a lower rear opening and a lower cooling fan which is positioned in the rear opening of the enclosure housing with an upper rear opening, and wherein the upper cooling fan and the lower cooling fan are adjacently coupled together to cause cooling air to flow towards the server module.

7. A server enclosure comprising:
   an enclosure housing including a front opening and a rear opening;

a pair of server modules each having a front portion, a rear portion, and an interface unit, such that the rear portions of the pair of server modules are exposed in the rear opening of the enclosure housing when horizontally inserted into a pair of module insertion/extraction parts of the enclosure housing in a direction from the front opening to the rear opening of the enclosure housing, wherein the rear portions of the pair of server modules have a reduced width with respect to the front portions of the pair of server modules;

a power supply unit disposed in a space formed between the rear portions of the pair of server modules; and a plurality of cooling fans disposed separately on opposite sides of the power supply unit such that the interface units of the pair of pair of server modules are located above or below the plurality of cooling fans in a rear end of the enclosure housing, wherein the rear portions of the pair server modules are connected to the power supply unit via a power distribution unit.

* * * * *